(12) United States Patent  
Chou et al.

(10) Patent No.: US 9,018,716 B1  
(45) Date of Patent: Apr. 28, 2015

(54) METAL MIGRATION-PROOF TOUCH PANEL STRUCTURE

(71) Applicants: Interface Optoelectronics (Shenzhen) Co., Ltd., Shenzhen, Guangdong (CN); General Interface Solution Limited, Miaoli County (TW)

(72) Inventors: Heng-Sheng Chou, Guangdong (CN); Pang-Chiang Chia, Guangdong (CN); Ying-Chi Wang, Guangdong (CN); An-Chi Hsu, Guangdong (CN)

(73) Assignee: Interface Optoelectronics (Shenzhen) Co., Ltd., Guangdong (CN)

( * ) Notice: Subject to any disclaimer, the term of this patent is extended or adjusted under 35 U.S.C. 154(b) by 0 days.

(21) Appl. No.: 14/555,785

(22) Filed: Nov. 28, 2014

(30) Foreign Application Priority Data

Nov. 19, 2014 (CN) .......................... 2014 1 0665151

(51) Int. Cl.
*H01L 29/82* (2006.01)
*H01L 23/60* (2006.01)

(52) U.S. Cl.
CPC ...................................... *H01L 23/60* (2013.01)

(58) Field of Classification Search
CPC ............ G06F 2203/04111; G06F 2203/04112; H01L 23/60
USPC ................... 257/415–420, E29.105, E21.002
See application file for complete search history.

(56) References Cited

U.S. PATENT DOCUMENTS 8,581,123 B2 * 11/2013 Ozeki et al. ................ 178/18.06

* cited by examiner

*Primary Examiner* — Cuong Q Nguyen  
(74) *Attorney, Agent, or Firm* — Rosenberg, Klein & Lee

(57) ABSTRACT

A metal migration-proof touch panel structure is proposed to solve the problem: metal migration occurs in the active area of a metal mesh-based touch panel and causes short circuit in metal traces. The present invention is characterized in indirectly linking the ESD dummy to the ground terminal via an ESD protection element to replace the conventional design that directly connects the ESD dummy with the ground terminal. Thus, the ESD dummy and the ground terminal are normally in an open-circuit state. While ESD interference occurs, the ESD protection element an impedance approaching zero ohms and fast conducts the energy to the ground terminal to drain off the energy. The ESD protection element is a varistor or a transient voltage suppressor.

11 Claims, 8 Drawing Sheets

US 9,018,716 B1

METAL MIGRATION-PROOF TOUCH PANEL STRUCTURE

This application claims priority for China patent application no. 201410665151.9 filed at Nov. 19, 2014, the content of which is incorporated by reference in its entirely.

BACKGROUND OF THE INVENTION

1. Field of the Invention

The present invention relates to a touch panel structure, particularly to a metal migration-proof touch panel structure.

2. Description of the Related Art

So far, touch panels have been extensively used in notebook computers and middle-large scale display panels. In the current trend, slim and lightweight products have superior competitiveness in the market. Therefore, fabricating slim and lightweight products is a motive for science and technology development. The conventional G/F/F structure and GF2 DITO structures are becoming out of date, and slimmer and more lightweight structures are being developed or have been developed. At present, many developing and developed structures can decrease the sheet resistance and realize slimmer and more lightweight touch panels, including the metal mesh structure. The metal mesh structure can replace the current ITO structure that has higher sheet resistance.

The metal mesh touch panel is normally made of silver, copper or another metal likely to ionize. After passing the reliability analysis, these metals are likely to be influenced by water and ionized. Thus, the stability and performance of products is affected. FIG. 1 schematically shows the process of silver ionization in a conventional touch panel structure. The silver metal, whose bonding 11 is stable originally, is influenced by water and ionized into active silver ions 21. As there is a potential drop between the metal traces and the ground terminal, the positive silver ions 21 are moved toward the negative electrode and reduced into silver atoms 31. As shown in FIG. 2, with time elapsing, the deposition of silver atoms 31 may cause short circuit of the traces 41 and 51 and affect the performance of the touch panel.

Based on many years' experience in the field and the related theories, the Inventors have been devoted to studying the abovementioned problems and finally propose a novel touch panel structure that can effectively avoid metal migration to solve the abovementioned problems. The principles and embodiments thereof will be described in detail below.

SUMMARY OF THE INVENTION

One objective of the present invention is to provide a metal migration-proof touch panel structure, which improves the conventional touch panel structure via using a metal mesh to replace the conventional transparent conductive film that has a drawback of higher impedance.

Another objective of the present invention is to provide a metal migration-proof touch panel structure, which comprises an ESD (Electrostatic Discharge) protection element and links to the ground terminal through the ESD protection element. While an ESD interference occurs, the ESD protection element can fast conduct the interfering energy to the ground terminal and drains off the interfering energy. Thereby, the present invention can prevent the interfering energy from inducing metal migration in the metal mesh of the touch panel.

A further objective of the present invention is to provide a metal migration-proof touch panel structure, whose ESD protection element is a varistor or a transient voltage suppressor, wherein the ESD protection element can adjust to have a resistance of from zero to infinite ohms. Thus, the ESD protection element can fast conduct the interfering energy to the ground terminal and drains off the interfering energy while an ESD interference occurs. Thereby, the present invention can prevent the interfering energy from inducing metal migration in the metal mesh of the touch panel.

In order to achieve the abovementioned objectives, the present invention proposes a metal migration-proof touch panel structure, which comprises a touch panel body having an active region of a metal-mesh touch panel; an ESD dummy surrounding the active region; and an ESD protection element electrically coupled to the ESD dummy, linking the ESD dummy to a ground terminal, and conducting an interfering energy to the ground terminal.

In one embodiment, the ESD protection element is a varistor or a transient voltage suppressor, which can absorb or draw away instant surge in the circuit and prevent the circuit from being burned down by external interfering energy.

When the ESD dummy and the ground terminal are in an open-circuit state, the impedance of the ESD protection element approaches infinite ohms. Once the external interfering energy is an ESD interference, the ESD protection element has an impedance approaching zero ohms, fast conducting the energy of the ESD interference to the ground terminal and draining off the energy. Thereby, the present invention can prevent ESD interfering energy from inducing metal migration in the active region of the metal-mesh touch panel.

Below, embodiments are described in detail in cooperation with the attached drawings to make easily understood the objectives, technical contents, characteristics and accomplishments of the present invention.

DETAILED DESCRIPTION OF THE INVENTION

Below, the technical contents and embodiments of the present invention will be described in detail to demonstrate the spirit, principles, characteristics, and efficacies of the present invention.

Figure 1:
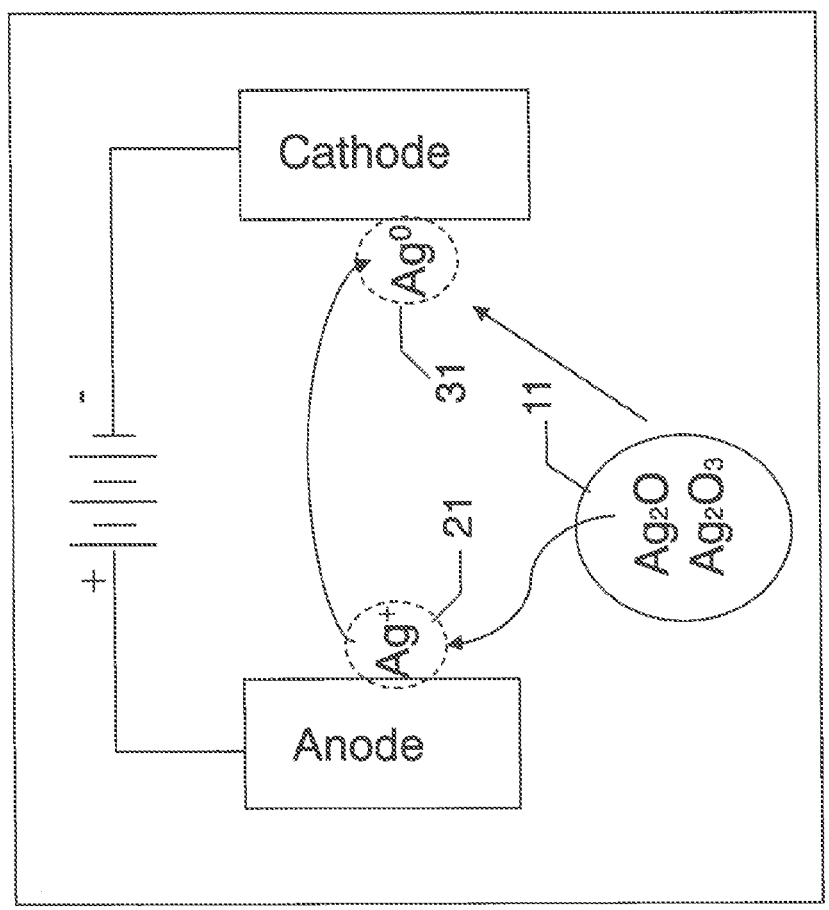
FIG. 1 schematically shows a process of silver ionization in a conventional touch panel structure.
Figure 2:
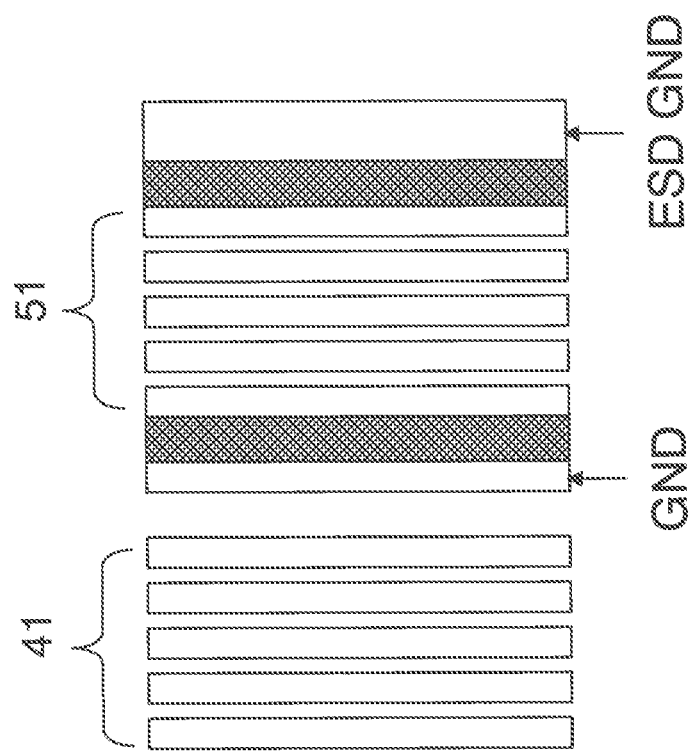
FIG. 2 schematically shows a short circuit problem caused by silver ionization in a conventional touch panel structure.
Figure 3:
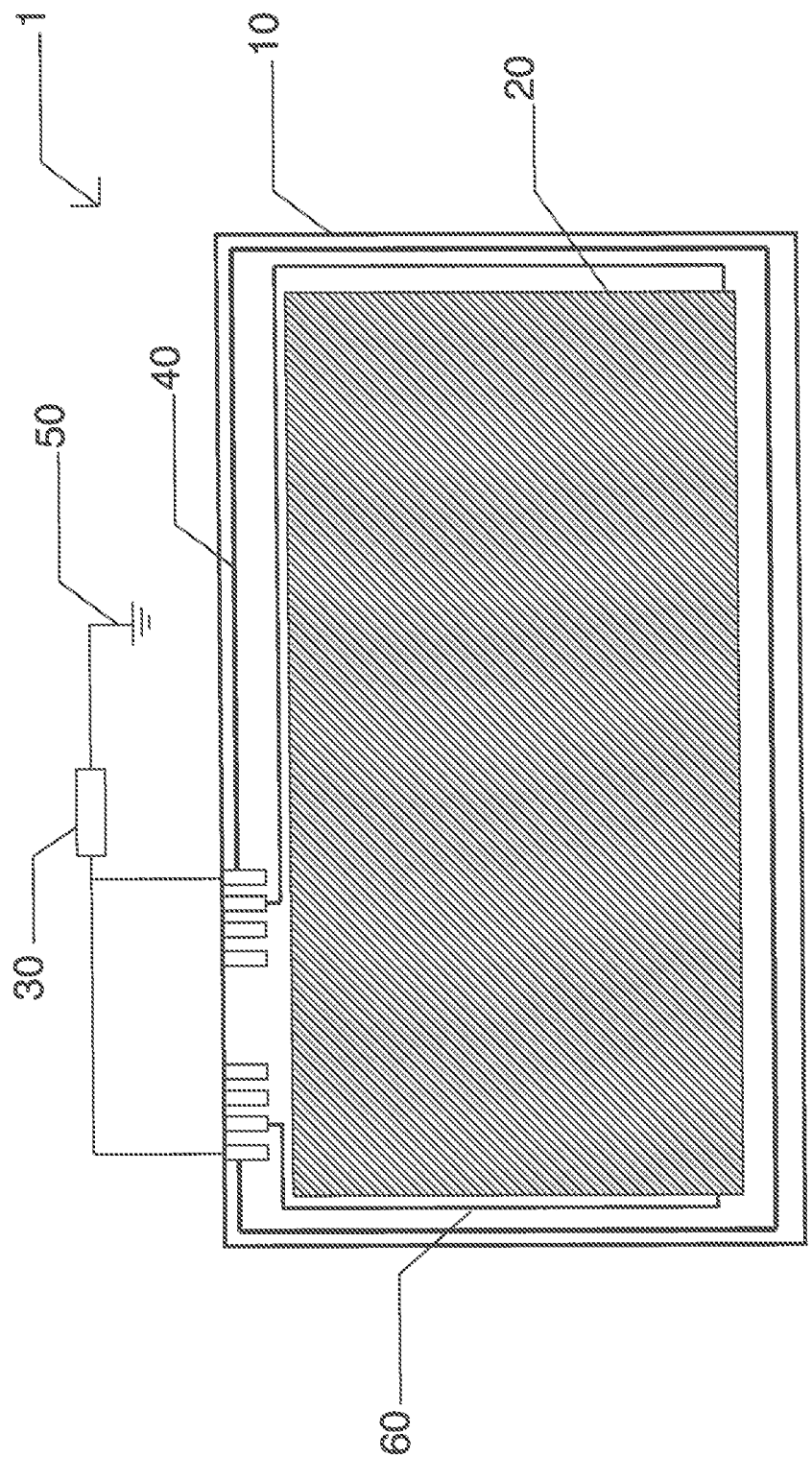
FIG. 3 schematically shows a metal migration-proof touch panel structure according to one embodiment of the present invention.

Refer to FIG. 3 schematically showing a metal migration-proof touch panel structure according to one embodiment of the present invention. The metal migration-proof touch panel structure 1 of the present invention comprises a touch panel body 10 having a touch panel active region (TPAA) 20 where a liquid crystal display or a touchscreen is defined, whereby the user can undertake different operations with different gestures of the hand. In the present invention, TPAA 20 is fabricated with a metal mesh to avoid high impedance of the ITO (Indium Tin Oxide) transparent conductive film. In one embodiment, the metal mesh is made of silver or copper. Experiments have proved that the metal mesh can successfully replace the ITO transparent conductive film.

In order to solve the problem that the metal migration is likely to induce short circuit in metal traces, the metal migration-proof touch panel structure 1 of the present invention further comprises an ESD (Electrostatic Discharge) protection element 30. As shown in FIG. 3, the ESD protection element 30 is mainly electrically coupled to an ESD dummy 40 running along the periphery of TPAA 20. The ESD dummy 40 is firstly electrically coupled to the ESD protection element 30 and then electrically linked to a ground terminal 50 through the ESD protection element 30. Once an interfering energy (such as an ESD interference) occurs in the touch panel structure, the interfering energy can be fast drained to the ground terminal 50 through the path of the ESD protection element 30. Thereby, the present invention can prevent from metal migration induced by the interfering energy in the metal traces of the touch panel.

Figure 4:
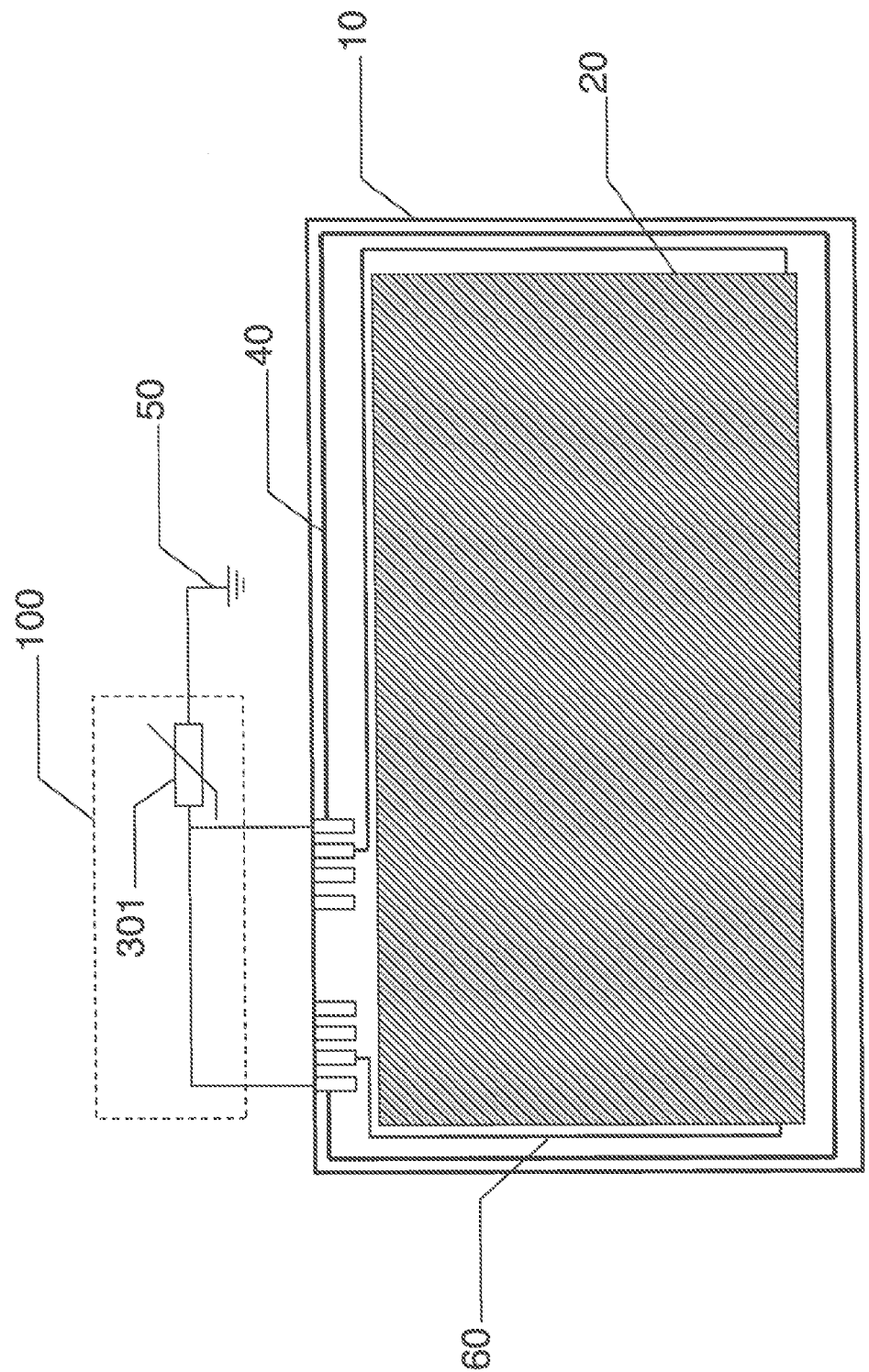
FIG. 4 schematically shows a metal migration-proof touch panel structure using a varistor as the EDS protection element according to one embodiment of the present invention.

Refer to FIG. 4 schematically showing a metal migration-proof touch panel structure using a varistor 301 as the EDS protection element 30 according to one embodiment of the present invention. In one embodiment, the varistor 301 is disposed on a circuit substrate 100; the circuit substrate 100 is electrically coupled to TPAA 20 through a signal receiving line (Rx) 60. In one embodiment, the circuit substrate 100 is a flexible printed circuit assembly (FPCA). In another embodiment, the circuit substrate 100 is a printed circuit board assembly (PCBA). As mentioned above, the ESD dummy 40 is firstly electrically coupled to the ESD protection element 30 and then electrically linked to the ground terminal 50 through the ESD protection element 30. Therefore, the ESD dummy 40 and the ground terminal 50 are normally in an open-circuit state. In the open-circuit state, the impedance of the varistor 301 approaches infinite ohms.

Figure 5:
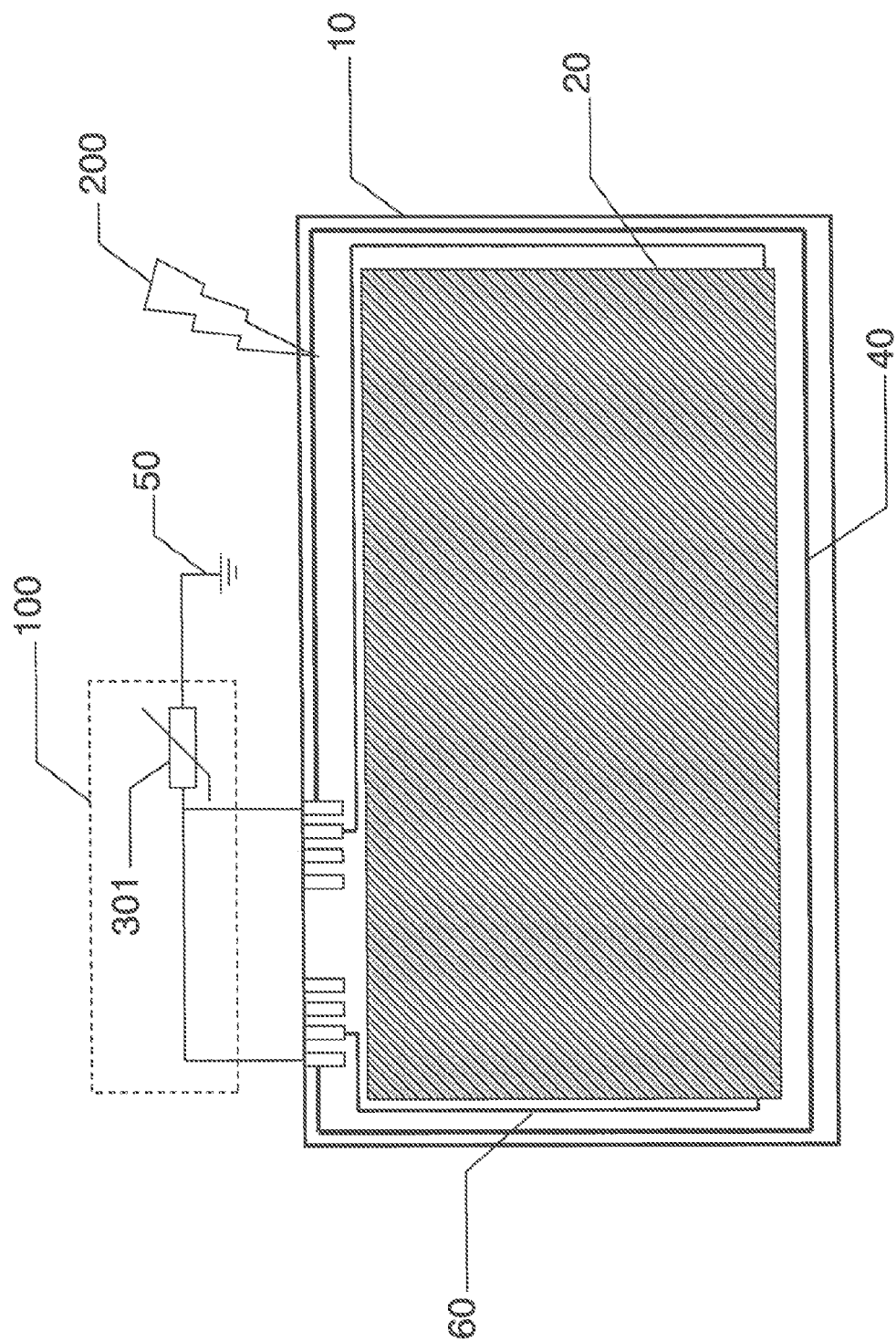
FIG. 5 schematically shows that an ESD interference occurs in the metal migration-proof touch panel structure shown in FIG. 4.
Figure 6:
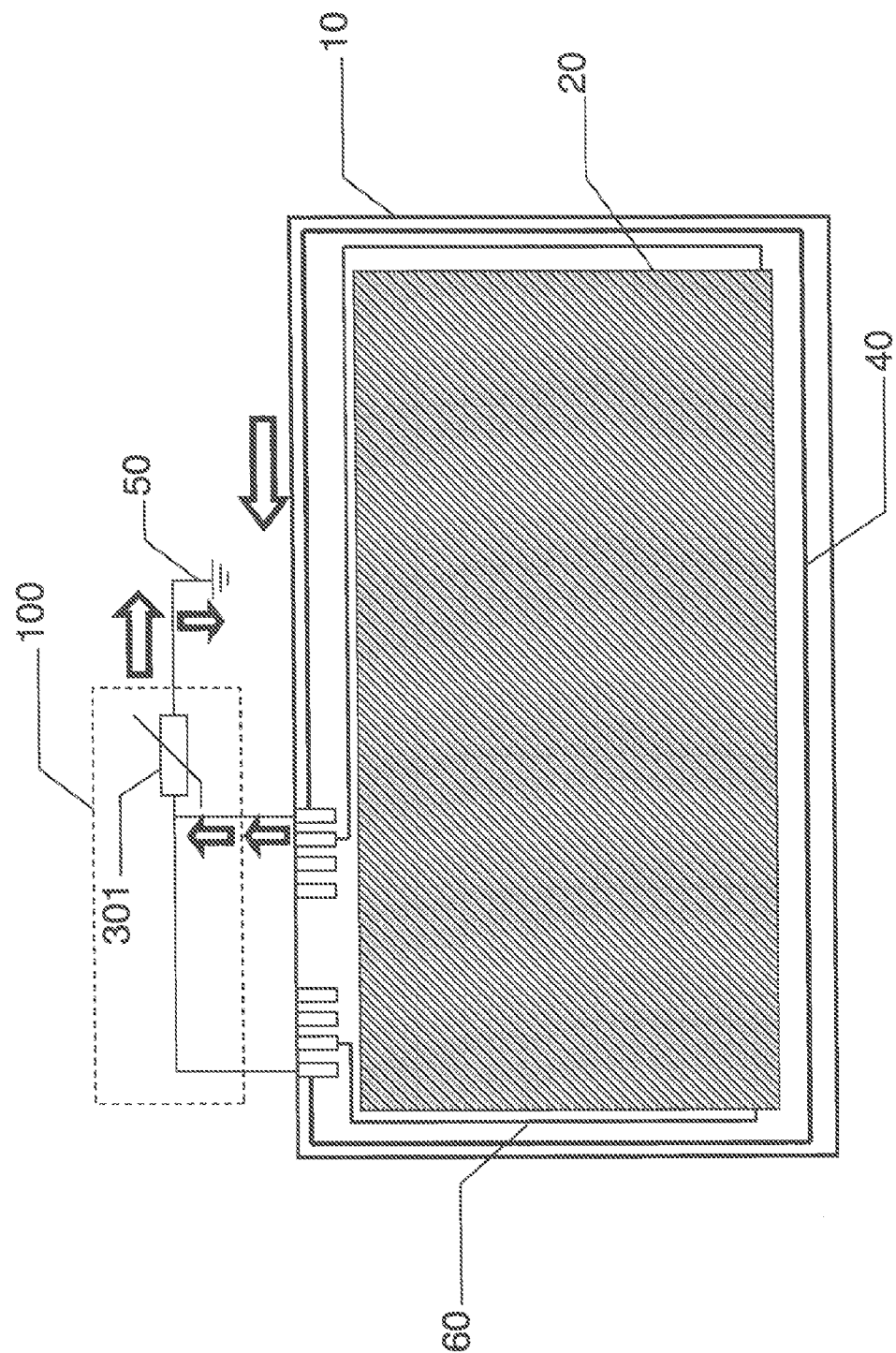
FIG. 6 schematically shows the action that ESD energy is drained off to a ground terminal in the metal migration-proof touch panel structure shown in FIG. 4.

Refer to FIG. 5 schematically showing that an ESD interference 200 occurs in the metal migration-proof touch panel structure shown in FIG. 4. In such a situation, the varistor 301 has an impedance approaching zero ohms, fast conducting the energy of the ESD interference 200 to the ground terminal 50 and draining off the energy. The path of draining off energy is indicated by the arrows shown in FIG. 6. The special design of the present invention not only can solve the problem that the potential drop between the signal receiving line 60 and the ground terminal 50 makes the positive ions of the metal move to the negative electrode but also can drain off ESD energy and exempt the touch panel from being damaged by ESD energy.

The varistor 301 is a voltage limiter applicable to low-frequency circuits. While overvoltage is within the upper limit and the lower limit, the varistor 301 clamps the voltage to a relatively fixed value according to the nonlinear characteristic thereof, whereby the succeeding circuit is protected. The capacitance of the varistor 301 is normally within hundreds of pF. It should be noted in designing a protection circuit: while applied to an AC (Alternating Current) circuit, the varistor 301 is likely to have higher leakage current because of its greater capacitance. As the varistor 301 operates in an impact absorption mode, its performance will degrade gradually. Therefore, the varistor 301 has a shorter service life and needs replacing in the long run. In one embodiment, a transient voltage suppressor (TVS) replaces the varistor 301.

Figure 7:
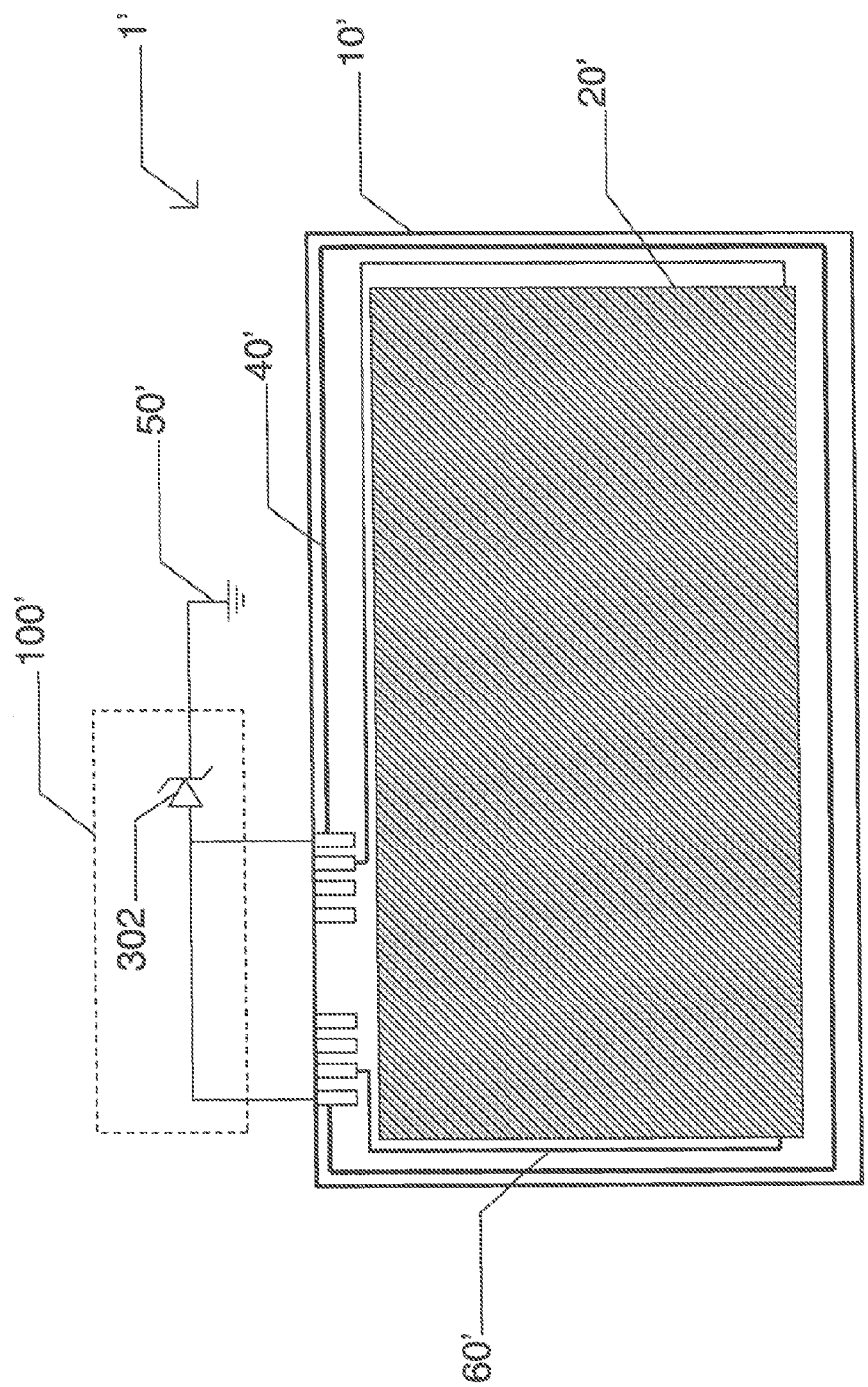
FIG. 7 schematically shows a metal migration-proof touch panel structure using a transient voltage suppressor as the EDS protection element according to one embodiment of the present invention.

Refer to FIG. 7 schematically showing a metal migration-proof touch panel structure using a transient voltage suppressor 302 as the EDS protection element 30 according to one embodiment of the present invention. In this embodiment, the touch panel structure 1' comprises a touch panel body 10' having TAPP 20'. The metal mesh of TAPP 20 is made of silver or copper, exempted from the conventional problem: the ITO transparent conductive film has higher impedance.

In the embodiment shown in FIG. 7, the transient voltage suppressor 302 is disposed on a circuit substrate 100', which is a flexible printed circuit assembly (FPCA) or a printed circuit board assembly (PCBA); the circuit substrate 100' is electrically coupled to TPAA 20' through a signal receiving line (Rx) 60'. As shown in FIG. 7, the transient voltage suppressor 302 is electrically coupled to an ESD dummy 40' running along the periphery of TPAA 20'. Thereby, the ESD dummy 40' is firstly electrically coupled to the transient voltage suppressor 302 and then electrically linked to a ground terminal 50' through the transient voltage suppressor 302.

Figure 8:
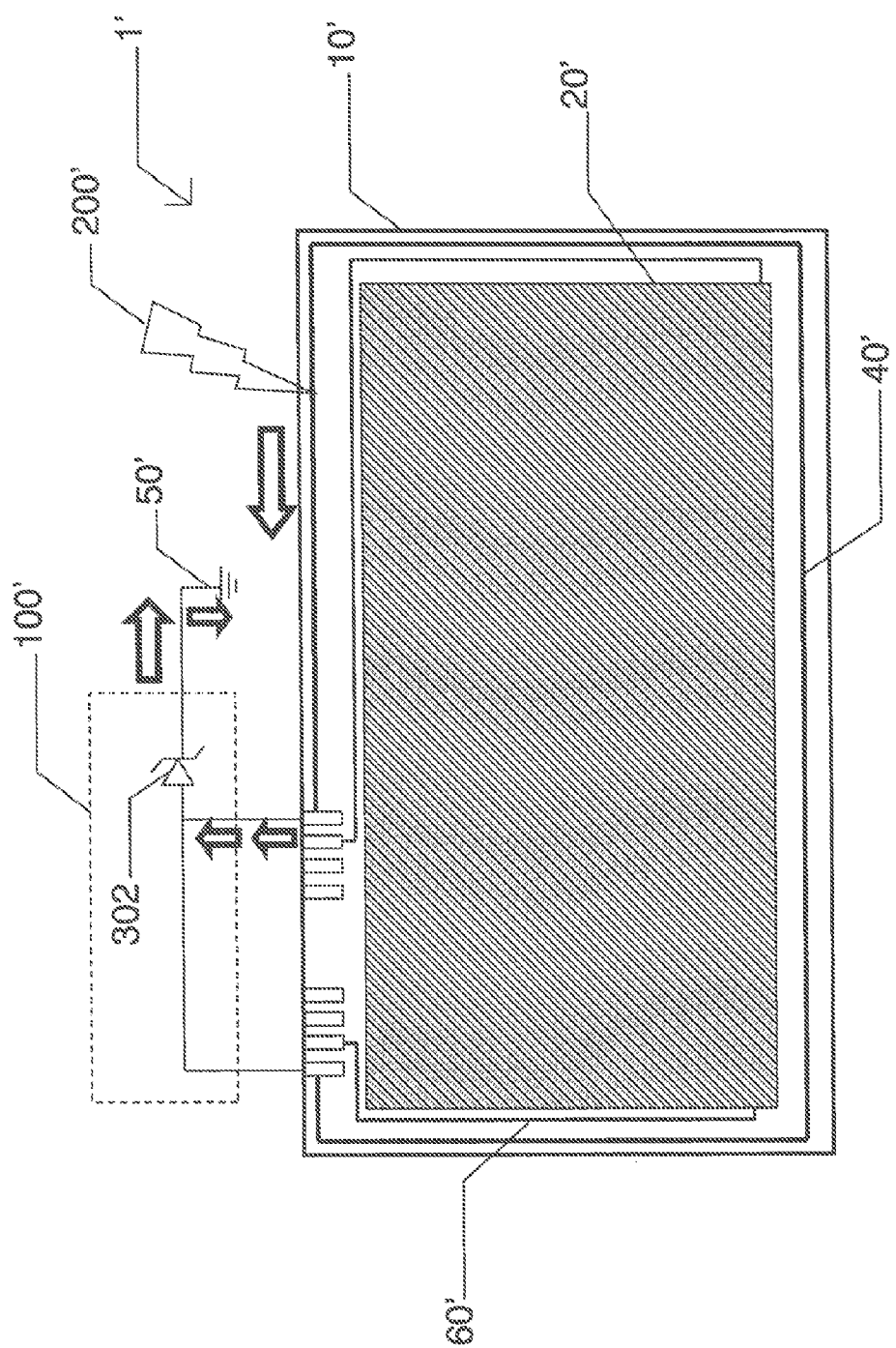
FIG. 8 schematically shows the action that ESD energy is drained off to a ground terminal in the metal migration-proof touch panel structure shown in FIG. 7.

The ESD dummy 40' and the ground terminal 50' are normally in an open-circuit state. In the open-circuit state, the impedance of the transient voltage suppressor 302 approaches infinite ohms. Refer to FIG. 8 schematically showing that an ESD interference 200' occurs in the metal migration-proof touch panel structure 1' shown in FIG. 7. In such a situation, the transient voltage suppressor 302 has an impedance approaching zero ohms, fast conducting the energy of the ESD interference 200' to the ground terminal 50' and draining off the energy. The path of draining off energy is indicated by the arrows shown in FIG. 8. Therefore, in addition to preventing from metal migration induced by the interfering energy, the present invention further drains off the transient current via the path provided by the transient voltage suppressor 302, exempting the main circuit from being punctured by overvoltage or being burned down by overcurrent.

Once the transient voltage disappears, the transient voltage suppressor 302 is automatically restored to the high impedance state, and the entire circuit system is restored to the normal state. A lot of protection elements would degrade in performance after absorbing impacts many times. However, the transient voltage suppressor 302 used by the present invention would not decay as long as it is used in the allowed range. Besides, the transient voltage diodes can be packaged into an array providing more discharging paths, having high integration and applicable to small-size handheld products. As the transient voltage suppressor has high package integration, low capacitance and low clamping voltage, it has been widely used in the related industry.

In conclusion, the present invention proposes a metal migration-proof touch panel structure to solve the problem of metal migration usually occurring in the conventional touch panel structure. The present invention is characterized in providing an ESD protection element connected with a ground terminal. In a normal state, the EDS dummy and the ground terminal are in an open-circuit state, and the ESD protection element has an impedance approaching infinite ohms. When an ESD interference occurs, the ESD protection element has an impedance approaching zero ohms, fast conducting the ESD energy to the ground terminal and draining off the energy.

Therefore, the touch panel structure of the present invention can fast conduct the ESD energy to the ground terminal and drain off the energy, exempting the metal mesh of the touch panel from metal migration induced by ESD.

The present invention has lower complexity and lower cost than the conventional technology, and outperforms the conventional technology in the ability to obviously eliminate metal migration in the metal traces and effectively prevent from short circuit in the metal traces. Therefore, the present invention has superior industrial utility and high commercial competitiveness.

The embodiments have been described in detail to demonstrate the technical thoughts and characteristics of the present invention to enable the persons skilled in the art to understand, make, and use the present invention. However, it should be noted: these embodiments are only to exemplify the present invention but not to limit the scope of the present invention. Any equivalent modification or variation according to the spirit of the present invention is to be also included within the scope of the present invention.

What is claimed is:

1. A metal migration-proof touch panel structure comprising
    a touch panel body having an active area of a metal mesh-based touch panel;
    an ESD (Electrostatic Discharge) dummy running along a periphery of said active area; and
    an ESD protection element electrically coupled to said ESD dummy, electrically linking said ESD dummy to a ground terminal, and conducting interfering energy to said ground terminal.

2. The metal migration-proof touch panel structure according to claim 1, wherein said active area includes a metal mesh structure.

3. The metal migration-proof touch panel structure according to claim 2, wherein said metal mesh structure is made of silver or copper.

4. The metal migration-proof touch panel structure according to claim 1, wherein said ESD protection element is a varistor.

5. The metal migration-proof touch panel structure according to claim 4, wherein said ESD protection element is disposed on a circuit substrate, and wherein said circuit substrate is electrically coupled to said active area via a signal receiving line.

6. The metal migration-proof touch panel structure according to claim 4, wherein said circuit substrate is a flexible printed circuit assembly (FPCA) or a printed circuit board assembly (PCBA).

7. The metal migration-proof touch panel structure according to claim 1, wherein said ESD protection element is a transient voltage suppressor.

8. The metal migration-proof touch panel structure according to claim 7, wherein said ESD protection element is disposed on a circuit substrate, and wherein said circuit substrate is electrically coupled to said active area via a signal receiving line.

9. The metal migration-proof touch panel structure according to claim 8, wherein said circuit substrate is a flexible printed circuit assembly (FPCA) or a printed circuit board assembly (PCBA).

10. The metal migration-proof touch panel structure according to claim 1, wherein while said ESD dummy and said ground terminal are in an open-circuit state, said ESD protection element has an impedance approaching infinite ohms.

11. The metal migration-proof touch panel structure according to claim 1, wherein while said interfering energy is ESD energy, said ESD protection element has an impedance approaching zero ohms, fast conducting said ESD energy to said ground terminal, draining off said ESD energy, and exempting said active area from metal migration induced by said ESD energy.

* * * * *